United States Patent
Klee et al.

[11] Patent Number: 6,007,868
[45] Date of Patent: Dec. 28, 1999

[54] METHOD OF MANUFACTURING FERROELECTRIC BISMUTH-TITANATE LAYERS ON A SUBSTRATE FROM SOLUTION

[75] Inventors: Mareike Klee, Hückelhoven; Wolfgang Brand, Aachen, both of Germany; Henricus A.M. Van Hal, Vessem, Netherlands

[73] Assignee: U.S. Philips Corporation, New York, N.Y.

[21] Appl. No.: 08/151,589

[22] Filed: Nov. 12, 1993

Related U.S. Application Data

[63] Continuation of application No. 07/927,702, Aug. 7, 1992, abandoned.

[30] Foreign Application Priority Data

Aug. 28, 1991 [DE] Germany .................................. 4128461

[51] Int. Cl.⁶ ...................................................... B05D 5/12
[52] U.S. Cl. ................... 427/100; 427/126.2; 427/126.3; 427/226; 427/240; 427/376.2; 427/419.3; 427/430.1
[58] Field of Search ................................ 252/62.2, 62.9; 29/25.35; 427/100, 126.2, 126.3, 226, 240, 376.2, 419.3, 430.1; 501/134

[56] References Cited

U.S. PATENT DOCUMENTS

| | | | |
|---|---|---|---|
| 3,699,044 | 10/1972 | Dosch et al. | 252/62.9 |
| 5,004,713 | 4/1991 | Bardhan et al. | 501/134 |
| 5,028,455 | 7/1991 | Miller et al. | 252/62.9 |
| 5,112,433 | 5/1992 | Dawson et al. | 252/62.9 |
| 5,160,762 | 11/1992 | Brand et al. | 427/226 |

FOREIGN PATENT DOCUMENTS

| | | | |
|---|---|---|---|
| 0134249A1 | 3/1985 | European Pat. Off. | H01G 4/10 |
| 0187383A2 | 7/1986 | European Pat. Off. | C01G 29/00 |

OTHER PUBLICATIONS

"Sol–Gel Processing of Computer Oxide Films," G. Yi et al., Ceramic Bulletin, vol. 70, No. 7, (1991) pp. 1173–1179.

*Primary Examiner*—Benjamin Utech
*Assistant Examiner*—Michael Barr

[57] ABSTRACT

A method is described of manufacturing ferroelectric bismuth-titanate layers $Bi_4Ti_3O_{12}$ on a substrate, A solution containing bismuth and titanium is provided, in a stoichiometric ratio, in the form of a metallo-organic or inorganic compound which is homogeneously mixed in an organic solvent, being brought into contact with the substrate and thermally treated at a temperature in the range from 500° C. to 650° C., thereby forming bismuth-titanate $Bi_4Ti_3O_{12}$.

17 Claims, No Drawings

METHOD OF MANUFACTURING FERROELECTRIC BISMUTH-TITANATE LAYERS ON A SUBSTRATE FROM SOLUTION

This application is a continuation application of U.S. Ser. No. 07/927,702, filed Aug. 7, 1992, now abandoned, and all benefits of such earlier application are hereby claimed for this continuation.

BACKGROUND OF THE INVENTION

The invention relates to a method of manufacturing ferroelectric layers of bismuth titanate $Bi_4Ti_3O_{12}$ on a substrate.

Thin ferroelectric layers are important for many electrical and optical applications such as, for example, the manufacture of memories, displays or capacitors. It is known that for such layers ferroelectric compounds having the perovskite structure are used. For ferroelectric memories use is made of, for example, lead-containing perovskite materials. However, these materials have the disadvantage that in their manufacture lead oxide is evaporated, in particular at high temperatures, as a result of which it is often very difficult to control the composition. Lead-containing perovskites such as, for example, $PbTi_{0.5}Zr_{0.5}O_3$ exhibit high dielectric constant values $\epsilon$ of approximately 1500. However, materials having a high dielectric constant can be used for ferroelectric memories only under certain conditions.

A ferroelectric material system which, in the manufacture, exhibits no lead-evaporation problems and which, in addition, has a relatively low dielectric constant ($\epsilon$<150) is bismuth titanate $Bi_4Ti_3O_{12}$. A further distinctive feature of this material is that on switching the ferroelectric material, a rotation through only 9° takes place along the c-axis of the polarization vector.

Up to now thin bismuth titanate layers have been manufactured by means of high-frequency cathode-sputtering methods in which MgO substrates are used. However, cathode-sputtering methods have the disadvantage that an accurate control of the stoichiometry of the layer composition in a multicomponent system is very difficult. In addition, carrying out experiments with these methods involves high costs because they must be conducted in a high vacuum. The deposition of multicomponent systems further requires a very accurate process control. An additional disadvantage of cathode-sputtering methods is that they are not suitable for continuous production processes. The known layers manufactured by means of cathode-sputtering methods had a thickness in the range from 12 to 32 $\mu$m. At such layer thicknesses, however, the ferroelectric layers cannot be used as memories.

SUMMARY OF THE INVENTION

It is an object of the invention to provide a method of the type described in the opening paragraph, by means of which thin ferroelectric bismuth-titanate layers can be manufactured reproducibly accurately as regards their stoichiometry in a continuous production process and at relatively low technical expenditure.

According to the invention, this object is achieved in that a solution containing bismuth and titanium, in a stoichiometric ratio, in the form of a metallo-organic or inorganic compound which is homogeneously mixed in an organic solvent mixture, is brought into contact with the substrate and thermally treated at a temperature in the range from 500° C. to 650° C., thereby forming bismuth titanate $Bi_4Ti_3O_{12}$.

Advantageous embodiments of the inventive method are described in the sub-claims. For example, a titanium compound can be formed from titanium alkoxide or titanium betadiketonate. In addition, the method may be carried out by either spin coating a solution onto the substrate or by immersing the substrate into the solution.

The advantages obtained by the invention consist, in particular, in that the present method is not carried out in a vacuum and, hence, layers can be manufactured in a very cost-effective manner.

Since the thin layers are deposited from solutions in accordance with the invention, the composition of the layers can be accurately controlled. The addition of dopants to improve electrical properties can readily be realised with the present method. In addition, the present chemical coating method can suitably be used for continuous production processes. The present method enables very thin bismuth-titanate layers having a thickness of approximately 0.1 to 2 $\mu$m to be manufactured at relatively low reaction temperatures in the range from 500 to 650° C. A particular advantage is formed by the relatively low reaction temperatures of the inventive method. Higher reaction temperatures are undesirable because they involve a higher energy consumption and because an increase in reaction temperature will almost certainly lead to a reaction of the layer with the substrate, which may lead to the formation of secondary phases which adversely affect the electrical properties of the layers such as, for example, polarization behaviour, switching time, aging behaviour.

DESCRIPTION OF THE INVENTION

The invention will be explained in greater detail by means of exemplary embodiments.

Example 1.

A quantity of 10 g of $Bi(NO_3)_3.5H_2O$ is dissolved in a solution of 12.5 ml of methoxy ethanol and 9.9 ml of glycerine. A quantity of 5.25 g of titanium-tetrabutylate is added to this solution. The solution thus obtained is passed through a cellulose acetate filter having a pore width of 0.2 $\mu$m to remove dust particles and undissolved crystallites, after which it is provided, under clean room conditions (dust class 100) on a (100)-oriented silicon single crystal substrate to which, subsequently, a 0.5 $\mu$m thick $SiO_2$-insulating layer, a 10 nm thick titanium layer and a 33 nm thick platinum layer, which serves as the bottom electrode layer, are provided. A thin layer is manufactured from the solution by spin coating the solution at 3000 r.p.m. This layer is heated at a rate of 250 K/h to a temperature of 500° C., tempered at this temperature for 60 minutes and cooled to room temperature at a rate of 250 K/h. The coating and heating processes are repeated five times.

Diffraction radiography revealed that the thin film thus produced crystallizes in the bismuth-titanate phase $Bi_4Ti_3O_{12}$. To carry out electrical checks, an upper electrode in the form of a thin gold layer is provided on the thin bismuth-titanate layer by evaporation. Capacitance and hysteresis measurements carried out on small capacitors manufactured in this manner show that the bismuth-titanate layer obtained is ferroelectric.

Example 2.

Bismuth octoate dissolved in mineral varnish (boiling point 100° C. to 190° C.) having a bismuth content of 20.15% by weight and titanium-tetrabutylate having a titanium content of 14.09% by weight are used as the starting substances. A quantity of 4.7878 g of the bismuth starting substance and 1.177 g of the titanium starting substance are dissolved in 5 ml of butanol.

The solution obtained is provided, under clean room conditions (dust class 100) on a (100)-oriented silicon single-crystal substrate on which, in succession, a 0.5 µm thick $SiO_2$ insulating layer, a 10 nm thick titanium layer and a 33 nm thick platinum layer, which serves as the bottom electrode layer, are provided. A thin layer is manufactured by spin coating the solution at 3000 rpm. The layer is heated to a temperature of 500° C. at a rate of 250 K/h, tempered at this temperature for 60 minutes and cooled to room temperature at a rate of 250 K/h. The coating and heating processes are repeated five times.

Diffraction radiography revealed that the thin layer thus manufactured crystallizes in the bismuth-titanate phase $Bi_4Ti_3O_{12}$.

Example 3.

The same starting substances in the same quantities as described in example 2 are dissolved in a mixture of 5 ml of buthanol and 1 ml of N,N-dimethylformamide. The solution obtained is provided under clean-room conditions (dust class 100) on a (100)-oriented silicon single-crystal substrate on which, in succession, a 0.5 µm thick $SiO_2$ insulating layer, a 10 nm thick titanium layer and a 33 nm thick platinum layer, which serves as the bottom electrode layer, are provided.

A thin layer is manufactured from the solution by spin coating the solution at 3000 rpm. The layer is heated at a rate of 250 K/h to a temperature of 500° C., tempered at this temperature for 60 minutes and cooled to room temperature at a rate of 250 K/h. The coating and heating processes are repeated five times.

Diffraction radiography revealed that the thin, very homogeneous layer thus manufactured crystallizes in the bismuth-titanate phase $Bi_4Ti_3O_{12}$.

We claim:

1. A method of manufacturing a ferroelectric layer of bismuth-titanate $Bi_4Ti_3O_{12}$ on a substrate, said method comprising the steps of
    a) forming a stoichiometric mixture of bismuth and titanium in the form of either a metallo-organic compound or a metallo-inorganic compound mixed or both in an organic solvent,
    b) homogeneously mixing said compounds in the solvent,
    c) applying said solution to a substrate,
    d) thermally treating said solution at reaction temperatures ranging from 500° C. to 650° C. in a vacuum free atmosphere so that, a layer of bismuth-titanate $Bi_4Ti_3O_{12}$ is formed on said substrate to a thickness of about 0.1 to 2 µm.

2. A method according to claim 1, wherein said step (d) is carried out by heating to said temperature at a rate of 250 K/h, tempering for about 60 minutes, and cooling to room temperature at a rate of 250 K/h.

3. A method according to claim 2, wherein the titanium compound is titanium alkoxide or titanium betadiketonate.

4. A method according to claim 3, wherein said titanium compound is titanium tetrabutylate.

5. A method according to claim 4, wherein said organic solvent is a solution of methoxyethanol and glycerine.

6. A method according to claim 4, wherein said organic solvent is a mixture of mineral varnish and butanol or butanol and N,N-dimethylformamide, said mineral varnish having a boiling point ranging from about 100° C. to about 190° C.

7. A method according to claim 2, wherein said titanium compound is titanium tetrabutylate.

8. A method according to claim 2, wherein said bismuth is $Bi(NO_3)_3.5H_2O$.

9. A method according to claim 2, wherein said bismuth is bismuthoctoate.

10. A method according to claim 2, wherein said organic solvent is a solution of methoxyethanol and glycerine.

11. A method according to claim 2, wherein said organic solvent is a mixture of mineral varnish and butanol or butanol and N,N-dimethylformamide, said mineral varnish having a boiling point ranging from about 100° C. to about 190° C.

12. A method according to claim 1, wherein said bismuth is $Bi(NO_3)_3.5H_2O$.

13. A method according to claim 12, wherein said organic solvent is a solution of methoxyethanol and glycerine.

14. A method according to claim 1, wherein said bismuth is bismuthoctoate.

15. A method according to claim 14, wherein said organic solvent is a mixture of of mineral varnish and butanol or butanol and N,N-dimethylformamide, said mineral varnish having a boiling point ranging from about 100° C. to about 190° C.

16. A method according to claim 1, wherein said step (c) is carried out by one of spin coating or immersing, and wherein said steps (c) and (d) are repeated until a predetermined thickness of said layer of bismuth-titanate $Bi_4Ti_3O_{12}$ is formed.

17. A method according to claim 1, wherein said substrate is a single-crystal silicon disc or a ceramic oxide disc.

* * * * *